United States Patent
Morikawa et al.

(10) Patent No.: US 10,421,099 B2
(45) Date of Patent: Sep. 24, 2019

(54) OPTICAL SCANNING APPARATUS

(71) Applicant: DENSO CORPORATION, Kariya, Aichi-pref. (JP)

(72) Inventors: Shohei Morikawa, Kariya (JP); Hikaru Sasaki, Kariya (JP)

(73) Assignee: DENSO CORPORATION, Kariya (JP)

( * ) Notice: Subject to any disclaimer, the term of this patent is extended or adjusted under 35 U.S.C. 154(b) by 205 days.

(21) Appl. No.: 15/561,535

(22) PCT Filed: May 25, 2016

(86) PCT No.: PCT/JP2016/002527
§ 371 (c)(1),
(2) Date: Sep. 26, 2017

(87) PCT Pub. No.: WO2016/208119
PCT Pub. Date: Dec. 29, 2016

(65) Prior Publication Data
US 2018/0065149 A1    Mar. 8, 2018

(30) Foreign Application Priority Data

Jun. 25, 2015  (JP) ................................ 2015-127991

(51) Int. Cl.
*B06B 1/06* (2006.01)
*G02B 26/08* (2006.01)
(Continued)

(52) U.S. Cl.
CPC ............ *B06B 1/0607* (2013.01); *G02B 26/08* (2013.01); *G02B 26/0833* (2013.01); *G02B 26/10* (2013.01); *B81B 3/0021* (2013.01)

(58) Field of Classification Search
CPC G02B 26/08; G02B 26/0816; G02B 26/0833; G02B 26/0841; G02B 26/085;
(Continued)

(56) References Cited

U.S. PATENT DOCUMENTS 8,941,905 B2 * 1/2015 Aimono ................. G02B 26/10
359/199.4
2002/0171902 A1 * 11/2002 Berhane ............. G02B 26/0841
359/230
(Continued)

FOREIGN PATENT DOCUMENTS

JP        2010-092018 A    4/2010
WO    WO-2010035537 A1 *  4/2010    ........... G02B 26/085

*Primary Examiner* — Frank G Font
(74) *Attorney, Agent, or Firm* — Posz Law Group, PLC

(57) ABSTRACT

A control circuit includes: an angular velocity calculator calculating an angular velocity of a mirror based on an angle of the mirror; a target angular velocity calculator calculating a target value of the angular velocity; a resonance frequency detector detecting a frequency of vibration of the mirror using the angular velocity and target value; a drive waveform generator generating a drive signal having sawtooth waveform; and an unnecessary vibration controller optimizing the drive signal to reduce an unnecessary vibration of the mirror based on the frequency of vibration of the mirror and providing piezoelectric elements with voltage according to the optimized drive signal. The resonance frequency detector detects the frequency of vibration of the mirror using a waveform and the target value of the angular velocity of the mirror during a duration in which the drive signal is transmitted to the unnecessary vibration controller from the drive waveform generator.

18 Claims, 4 Drawing Sheets

(51) Int. Cl.
 G02B 26/10 (2006.01)
 B81B 3/00 (2006.01)
(58) Field of Classification Search
 CPC ............ G02B 26/0858; G02B 26/0866; G02B 26/10; G02B 26/101; B06B 1/0607; B81B 3/0021
 USPC ................................ 359/224.1, 225.1, 226.2
 See application file for complete search history.

(56) References Cited

U.S. PATENT DOCUMENTS

| | | | | |
|---|---|---|---|---|
| 2005/0146540 A1* | 7/2005 | Marshall | ............ | G02B 26/0816 345/698 |
| 2008/0239445 A1* | 10/2008 | Ando | ................... | G02B 7/1821 359/224.1 |
| 2009/0059193 A1* | 3/2009 | Tanaka | ................. | G02B 26/101 355/51 |
| 2009/0244668 A1* | 10/2009 | Fujino | ................. | G02B 26/0841 359/200.6 |
| 2009/0251756 A1* | 10/2009 | Nishizawa | ......... | G02B 26/0841 359/223.1 |
| 2011/0141538 A1* | 6/2011 | Mizumoto | ......... | G02B 26/0841 359/224.1 |
| 2012/0001961 A1 | 1/2012 | Nishikawa et al. | | |
| 2013/0258432 A1* | 10/2013 | Aimono | ................. | G02B 26/10 359/200.8 |
| 2015/0043047 A1* | 2/2015 | Chikaoka | ............ | G02B 26/101 359/199.3 |
| 2015/0138623 A1* | 5/2015 | Graves | ................. | G02B 6/3518 359/290 |

* cited by examiner

OPTICAL SCANNING APPARATUS

CROSS REFERENCE TO RELATED APPLICATIONS

The present application is the U.S. national phase of International Patent Application No. PCT/JP2016/002527 filed on 25 May 2016 and is based on Japanese Patent Application No. 2015-127991 filed on 25 Jun. 2015, the contents of which are incorporated herein by reference.

TECHNICAL FIELD

The present disclosure relates to a two-axes optical scanning apparatus.

BACKGROUND ART

There is conventionally proposed an optical scanning apparatus such as a laser scanning module that performs a two-dimensional scan of a laser light emitted from an RGB (Red Green Blue) light source using an MEMS (Micro Electro Mechanical Systems) mirror, and draws a predetermined image on a screen.

Such an optical scanning apparatus includes: a mirror; support beams that support both opposite sides of the mirror; a resonance driver part that supports the mirror via the support beams; and a compulsive driver part that supports the resonance driver part. The optical scanning apparatus rotates the mirror about two axes that are orthogonal to each other by applying the voltage to piezoelectric films that are provided to the resonance driver part and the compulsive driver part, thereby allowing the two-dimensional scan of the image formation position using the mirror.

The rotation of the mirror by the compulsive driver part is slower than the rotation by the resonance driver part. The waveform of the voltage applied to the piezoelectric films provided to the compulsive driver part is formed to be a sawtooth waveform. The resonance composition contained in the higher harmonic wave having this sawtooth waveform causes the resonance vibration of the mirror; this sometimes poses the unnecessary vibration called ringing.

The frequency of the resonance composition causing the ringing changes depending on the temperature, the acceleration applied to the mirror, or the deterioration of the mirror. In addition, the frequency changes sharply and rapidly, e.g., when the optical scanning apparatus is mounted in a vehicle.

The frequency components leading to the ringing thus need to be removed from the drive signal by detecting the ringing state, e.g., the resonance frequency of the ringing, while driving the optical scanning apparatus. For instance, Patent literature 1 describes an optical deflector that detects the frequency components causing the ringing by analyzing frequency components with FFT of the data acquired by the frequency sweep of the drive signal, and eliminates the detected frequency components from the drive signal with a filter.

PRIOR ART LITERATURES

Patent Literature

Patent literature 1: JP 2013-205818 A

SUMMARY OF INVENTION

When the frequency of the ringing is detected using the frequency sweep of the drive signal, the waveform of the drive signal during the detection is not a sawtooth wave but a sine wave. This prevents normal drawing of the image. The drawing of the image needs to be stopped during the detection of the frequency of the ringing.

In considering the above issue, it is an object of the present disclosure is provide an optical scanning apparatus that is capable of detecting the frequency of the ringing even during scanning.

To achieve the above object, according to an aspect of the present disclosure, an optical scanning apparatus is provided to include: a mirror having a reflective face to reflect a light beam; support beams configured to support the mirror respectively at opposite sides in a one direction on the reflective face of the mirror, the support beams being extended respectively in opposite directions in the one direction; a resonance driver part configured to swing the mirror about a first axis parallel with the one direction by applying resonance vibration to the support beams; a compulsive driver part configured to swing the mirror about a second axis parallel with a different direction different from the one direction by providing piezoelectric elements with a voltage; an angle measurer part configured to measure an angle about the second axis of the mirror; and a control circuit configured to provide the piezoelectric elements with a voltage according to an output of the angle measurer part. The control circuit includes: an angular velocity calculator configured to calculate an angular velocity about the second axis of the mirror based on the angle of the mirror measured by the angle measurer part; a target angular velocity calculator configure to calculate a target value of the angular velocity; a resonance frequency detector configured to detect a frequency of vibration about the second axis of the mirror using the angular velocity and the target value; a drive waveform generator configured to generate a drive signal having a sawtooth waveform; and an unnecessary vibration controller configured to optimize the drive signal to reduce an unnecessary vibration about the second axis of the mirror based on the frequency of vibration of the mirror detected by the resonance frequency detector and provide the piezoelectric elements with a voltage according to the optimized drive signal. The resonance frequency detector detects the frequency of vibration of the mirror using a waveform and the target value of the angular velocity of the mirror during a duration in which the drive signal having the sawtooth waveform is transmitted to the unnecessary vibration controller from the drive waveform generator.

Under such a configuration, the resonance frequency detector detects the frequency of the vibration of the mirror using the waveform and the target value of the angular velocity of the mirror during a duration in which the drive signal having a sawtooth waveform is transmitted to the unnecessary vibration controller from the drive waveform generator. This allows the detection of the frequency of ringing during the scanning.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

The following will explain embodiments of the present disclosure with reference to drawings. In the embodiments mentioned below, explanations are made by assigning mutually identical or equivalent members with an identical reference sign.

First Embodiment

The following will describe a first embodiment of the present disclosure. The optical scanning apparatus 100 according to the present embodiment is a two-axes optical scanning apparatus that rotates an MEMS mirror about two axes that are orthogonal to each other and enables the two-dimensional scanning of the image formation position by the MEMS mirror.

Figure 1:
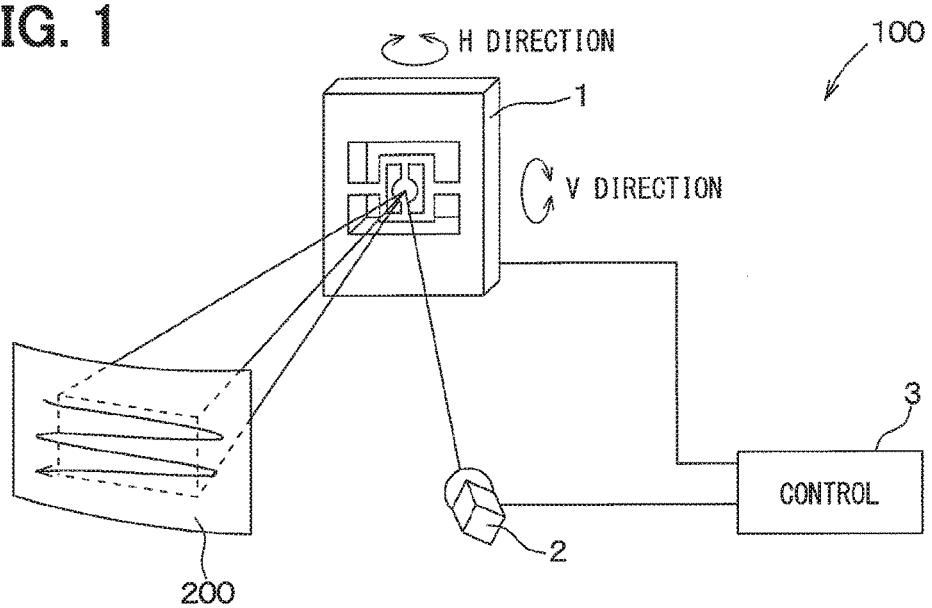
FIG. 1 is a diagram illustrating an overall configuration of an optical scanning apparatus according to a first embodiment.

As illustrated in FIG. 1, the optical scanning apparatus 100, which includes a reflector part 1, a light source 2, and a control circuit 3, controls an actuator included in the reflector part 1 with the control circuit 3 and reflects a light beam emitted from the light source 2 with the reflector part 1, thereby drawing an image on a screen 200.

Figure 2:
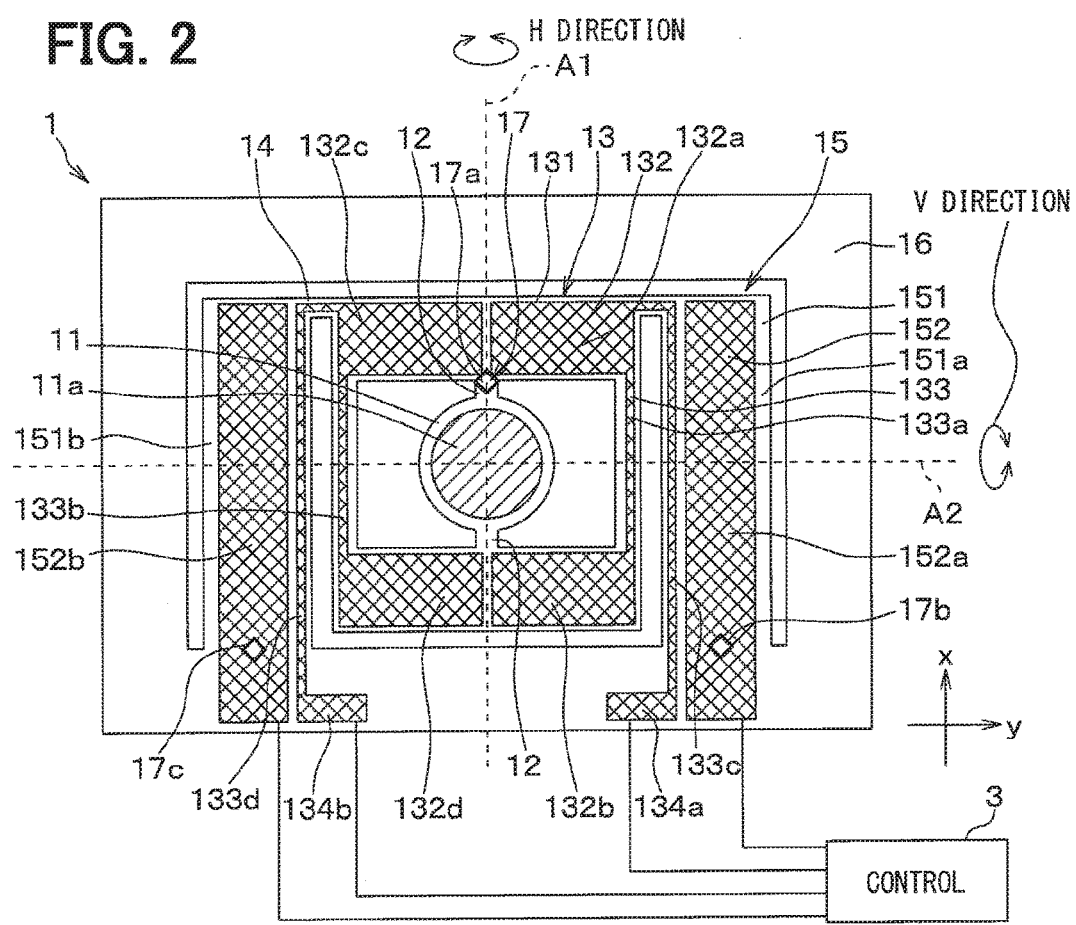
FIG. 2 is a top view illustrating a configuration of a reflector part.

As illustrated in FIG. 2, the reflector part 1, which reflects the light beam radiated from the light source 2, includes a mirror 11, support beams 12, a resonance driver part 13, connector parts 14, a compulsive driver part 15, a supporter part 16, and angle sensors 17. Just to easily understand, FIG. 2, which is not a sectional view, is provided with hatching on a reflective face 11a, piezoelectric elements 132, wirings 133, pads 134a and 134b, and piezoelectric elements 152, which are explained later.

The constituent elements included in the reflector part 1 are formed using a plate-shaped substrate 10. In the present embodiment, the substrate 10 is configured to be an SOI (Silicon on Insulator) substrate that laminates, in sequence, an active layer, a BOX layer (Buried Oxide), and a support layer. For instance, the active layer is configured to be Si; the BOX layer is configured to be $SiO_2$; and the support layer is configured to be Si. The active layer is patterned to be the constituent elements included in the reflector part 1.

The mirror 11 reflects the light beam radiated by the reflector part 1. The mirror 11 is a portion formed by patterning the active layer of the substrate 10 to be shaped of a circle. As illustrated in FIG. 2, a reflective face 11a, which is configured to be Al, etc., is formed on an upper surface of the mirror 11.

The reflective face 11a has a plane with an x direction and a y direction, which are orthogonal to each other. As in FIG. 2, the mirror 11 is supported at opposite sides of the mirror 1 by the respective support beams 12 that extend in opposite directions in the x direction with the mirror 1 centered. The support beams 12 allow the mirror 11 to swing about an axis A1 parallel with the x direction.

As in FIG. 2, the mirror 11 is supported by the resonance driver part 13 via the support beams 12. The resonance driver part 13 swings the mirror 11 about the axis A1 by causing the support beams 12 to have resonance vibration. The axis A1 is equivalent to a first axis. The resonance driver part 13 is configured to form four piezoelectric elements 132 and wirings 133 on an upper surface of a frame body 131 having a rectangular shape which is formed by patterning the active layer of the substrate 10. Each of the support beams 12 is connected with a central portion of each of the opposite sides of the frame body 131.

The piezoelectric elements 132 each have a configuration that laminates in sequence an upper electrode, a piezoelectric film, and a lower electrode. The lower electrode and the upper electrode are configured to be Al, Au, or Pt, for instance. In addition, the piezoelectric film is made of a piezoelectric material such as lead zirconate titanate (PZT). Further, each of the lower electrode and the upper electrode may have a laminated structure of Pt/Ti.

Four piezoelectric elements 132 are piezoelectric elements 132a, 132b, 132c, and 132d. As in FIG. 2, the piezoelectric elements 132a and 132b are arranged on one side with respect to the axis A1; the piezoelectric elements 132c and 132d are arranged on the other side which is opposite to the one side with respect to the axis A1. Further, the piezoelectric elements 132a and 132c are arranged on one side in the x direction of the mirror 11; the piezoelectric elements 132b and 132d are arranged on the other side which is opposite to the one side in the x direction.

The wirings 133, each of which has a configuration that laminates in sequence an upper wiring, an insulator layer, and a lower wiring, are divided into four wirings 133a, 133b, 133c, and 133d, as illustrated in FIG. 2. The lower wiring and upper wiring are formed of Al, Au, Pt, etc., like the lower electrode and upper electrode of the piezoelectric element 132. In addition, the insulator layer is made of lead zirconate titanate (PZT), for instance. Further, each of the lower wiring and the upper wiring may have a laminated structure of Pt/T.

As illustrated in FIG. 2, the wiring 133a, which is formed on an upper surface of the frame body 131, connects electrically the piezoelectric element 132a with the piezoelectric element 132b. The wiring 133b, which is formed on an upper surface of the frame body 131, connects electrically the piezoelectric element 132c with the piezoelectric element 132d.

The wirings 133c and 133d connect the piezoelectric elements 132a and 132c, respectively, to the pads 134a and 134b formed in the upper surface of the supporter part 16; the wirings 133c and 133d are formed in the portion from the frame body 131 via the connector part 14 and the compulsive driver part 15 to the supporter part 16 among the upper surface of the active layer of the substrate 10. The pads 134a and 134b are connected to the control circuit 3.

As illustrated in FIG. 2, each connector part 14 is extended in the y direction outwardly from one end in the x direction of the frame body 131. The connector part 14 is connected with the compulsive driver part 15 at the other end which is opposite to the one end of the frame body 131.

The compulsive driver part 15 swings the frame body 131 about the axis parallel with the y direction via the connector part 14, thereby swinging the mirror 11 about an axis A2 parallel with the y direction. The axis A2 is equivalent to a second axis. The compulsive driver part 15 is configured to form two piezoelectric elements 152 on an upper surface of base parts 151 which is formed by patterning the active layer of the substrate 10.

As illustrated in FIG. 2, the base parts 151, which are arranged individually on both opposite sides of the mirror 11 in the y direction, are extended in the x direction. Each base part 151 is connected with the connector part 14 at one end in the x direction, and is connected with the supporter part 16 at the other end which is opposite to the one end in the x direction. Of the base parts 151, the base part 151a is arranged on the same side of the piezoelectric elements 132a and 132b with respect to the mirror 11 in the y direction; the base part 151b is arranged on the same side of the piezoelectric elements 132c and 132d with respect to the mirror 11 in the y direction.

The piezoelectric elements 152 each have a configuration that laminates in sequence an upper electrode, a piezoelectric film, and a lower electrode. The lower electrode and upper electrode of each piezoelectric element 152 are made of Al, Au, Pt, etc. In addition, the piezoelectric film is made of piezoelectric material such as lead zirconate titanate (PZT), for instance. Further, each of the lower electrode and the upper electrode may have a laminated structure of Pt/Ti.

Two piezoelectric elements 152 are the piezoelectric elements 152a and 152b individually. As illustrated in FIG. 2, each of the piezoelectric elements 152a and 152b is formed respectively on the upper surface of each of the base parts 151a and 151b, and formed from the end connected with each of the connector parts 14 on the upper surface of each of the base parts 151a and 151b to an upper surface of the supporter part 16. The piezoelectric elements 152a and 152b are connected to the control circuit 3.

The wiring 133c is arranged on the upper surface of the base part 151a in a portion closer to the mirror 11 in the y direction than the piezoelectric element 152a; the wiring 133d is arranged on the upper surface of the base part 151b in a portion closer to the mirror 11 in the y direction than the piezoelectric element 152b. Each of the wirings 133c and 133d is formed from each of the connector parts 14 to the supporter part 16.

The supporter part 16, which supports the mirror 11 via the support beams 12, the resonance driver part 13, the connector parts 14, and the compulsive driver part 15, is formed to be a rectangular frame body arranging internally the mirror 11, the support beams 12, the resonance driver part 13, the connector parts 14, and the compulsive driver part 15. Note that, of the resonance driver part 13 and the compulsive driver part 15, part of the wirings 133c and 133d, the pads 134a and 134b, and part of the piezoelectric elements 152a and 152b are formed on the upper surface of the supporter part 16.

Three angle sensors 17 are installed on the upper surface of the compulsive driver part 15 and the support beams 12. The angle sensors 17, which measure angles about the axis A1 and the axis A2 of the mirror 11, are configured to be strain gauges for instance.

Three angle sensors 17 are angle sensors 17a, 17b, and 17c. As illustrated in FIG. 2, the angle sensor 17a is installed on the upper surface of the support beam 12; the angle sensors 17b and 17c are respectively Installed on the upper surface of the piezoelectric elements 152a and 152b. In addition, the angle sensors 17a, 17b, and 17c are connected to the control circuit 3 via wirings (unshown).

The angle sensor 17a outputs the signal according to the angle about the axis A1 of the mirror 11; the output of the angle sensor 17a is used to control the resonance drive by the resonance driver part 13. The angle sensors 17b and 17c output the signal according to the angle about the axis A2 of the mirror 11; the output of the angle sensors 17b and 17c are used for the compulsive driver part 15 to control the compulsive drive in an operation in FIG. 5 to be described later. The angle sensors 17b and 17c are equivalent to the angle measurer part.

The reflector part 1 is configured as explained above. This reflector part 1 is manufactured by forming each piezoelectric element, each wiring, each pad, the reflective face 11a, and the angle sensors 17 on the active layer with the photolithography and etching, and patterning the substrate 10 to form the mirror 11 etc., as mentioned above.

The light source 2 is an RGB laser unit which radiates the light beam onto the reflector part 1. The light source 2, which is connected to the control circuit 3 as illustrated in FIG. 1, changes the color of the radiated light beam based on the signal from the control circuit 3.

The control circuit 3 generates the drive signal for the resonance driver part 13 and the compulsive driver part 15 depending on the output of the angle sensors 17, and applies the voltage according to the drive signal to the piezoelectric elements included in the resonance driver part 13 and the compulsive driver part 15. In addition, the control circuit 3 controls the light source 2.

The control circuit 3 is also referred to as an electronic control unit. In the present embodiment, as one example, the control circuit 3 is configured as including a microcomputer having a CPU and storages such as ROM, RAM and peripheral circuits. The control circuit 3 includes a drive waveform generator 31 (which is also referred to as a drive waveform generator section 31), an unnecessary vibration controller 32 (which is also referred to as an unnecessary vibration controller section 32), a resonance characteristic detector 33 (which is also referred to as a resonance characteristic detector section 33), an angular velocity calculator 34 (which is also referred to as an angular velocity calculator section 34), and a target angular velocity calculator 35 (which is also referred to as a target angular velocity calculator section 35). Note that those constituent elements may be achieved by the CPU executing software stored in the ROM etc.; in contrast, a part or all of each constituent element may be also achieved by a hardware circuit.

Figure 3:
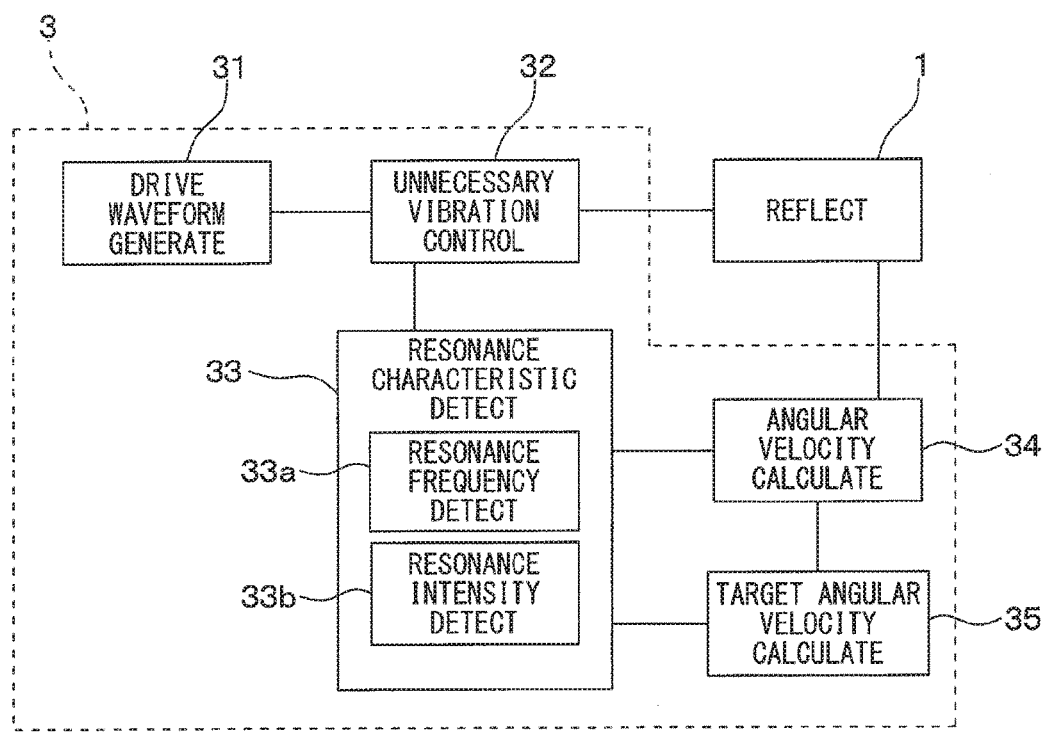
FIG. 3 is a diagram illustrating a configuration of a control circuit.

The drive waveform generator 31 generates a drive signal having a sawtooth waveform in which a decreasing portion and an increasing portion are alternated repeatedly. In the decreasing portion, the magnitude of the signal decreases by a decreasing amount for a decreasing period of time; in the increasing portion, the magnitude of the signal increases by an increasing amount equal to the decreasing amount for an increasing period of time shorter than the decreasing period of time. The drive waveform generator 31 generates a drive signal having a sawtooth waveform as a combined wave by combining several sine waves having mutually different frequencies. As illustrated in FIG. 3, the drive waveform generator 31 is connected with the unnecessary vibration controller 32; the drive signal generated by the drive waveform generator 31 is transmitted to the unnecessary vibration controller 32.

The unnecessary vibration controller 32 is to optimize the drive signal so as to reduce the ringing about the axis A2 of the mirror 11 based on the characteristic of ringing of the mirror 11 such as the frequency. In detail, the unnecessary vibration controller 32, which is connected with the resonance characteristic detector 33 as in FIG. 3, removes the frequency components leading to the ringing from the drive signal using the notch filter based on the frequency of vibration of the mirror 11 detected by the resonance characteristic detector 33.

In addition, as illustrated in FIG. 3, the unnecessary vibration controller 32 is connected with the reflector part 1.

The control circuit 3 applied the voltage according to the drive signal optimized by the unnecessary vibration controller 32 to the piezoelectric elements 152 included in the compulsive driver part 15 of the reflector part 1.

The resonance characteristic detector 33, which detects the characteristic of the ringing of the mirror 11, includes a resonance frequency detector 33a and a resonance intensity detector 33b as illustrated in FIG. 3. The resonance frequency detector 33a detects the frequency of the ringing of the mirror 11. The resonance frequency detector 33a detects the frequency of the ringing about the axis A2 of the mirror 11 using the waveform of the angular velocity and the target value of the angular velocity of the mirror 11 during a duration in which the drive signal having a sawtooth waveform is transmitted from the drive waveform generator 31 to the unnecessary vibration controller 32.

The resonance intensity detector 33b detects the intensity of the ringing of the mirror 11. The resonance intensity detector 33b detects the intensity of the ringing by comparing the angular velocity of the mirror 11 calculated by the angular velocity calculator 34 with the target value of the angular velocity of the mirror 11 calculated by the target angular velocity calculator 35. The resonance characteristic detector 33 transmits the signal according to the detected frequency and intensity of the ringing of the mirror 11 to the unnecessary vibration controller 32.

The angular velocity calculator 34 calculates the angular velocity about the axis A2 of the mirror 11 based on the angle of the mirror 11 measured by the angle sensors 17b and 17c in the reflector part 1. The angular velocity calculator 34, which is connected with the resonance characteristic detector 33 and the target angular velocity calculator 35 as illustrated in FIG. 3, transmits the signal according to the calculated angular velocity of the mirror 11 to the resonance characteristic detector 33 and the target angular velocity calculator 35.

The target angular velocity calculator 35 calculates the target value of the angular velocity about the axis A2 of the mirror 11 in a drawing segment. In the present embodiment, the target angular velocity calculator 35 calculates, as a target value of the angular velocity of the mirror 11, the average value calculated by the angular velocity calculator 34 in the drawing segment.

Note that the drawing segment is a linear segment in the waveform obtained from the optimization, which the unnecessary vibration controller 32 applies to the drive signal having the sawtooth waveform generated by the drive waveform generator 31. In the linear segment, the magnitude in change of the waveform per time is within a predetermined range centering on a constant value.

When the target angular velocity calculator 35 calculates the average value of the angular velocity of the mirror 11 as the target value, the magnitude in change per time needs to be constant in the waveform obtained from the optimization by the unnecessary vibration controller 32 applied to the drive signal. In addition, in general, a drawing apparatus using the MEMS mirror draws by using a linear segment among the sawtooth waveform; in the linear segment, the magnitude in change per time is constant in order to maintain the luminance. Therefore, the characteristic of the ringing can be easily detected by calculating the average value of the angular velocity which the angular velocity calculator 34 calculates in the drawing segment as a target value, without transmitting the signal other than the sawtooth waveform to the unnecessary vibration controller 32.

The mirror 11 swings in H direction in FIGS. 1 and 2 by the resonance driver part 13, and swings in V direction in FIGS. 1 and 2 by the compulsive driver part 15. In addition, in the swing in the V direction, the mirror 11 swings in one direction at a low speed while swinging in the other direction at a high speed. In the graph of the angular velocity of the mirror 11, the drawing segment corresponds to a segment in which the mirror 11 moves in the V direction at a slow speed while reflecting the light beam from the light source 2.

Note that at S105 mentioned later, the Q value and the center frequency of the notch filter are changed so that the position and magnitude of the drawing segment may change.

As illustrated in FIG. 3, the target angular velocity calculator 35 is connected with the resonance characteristic detector 33, and transmits the signal according to the calculated target value of the angular velocity of the mirror 11 to the resonance characteristic detector 33.

In the optical scanning apparatus 100 having the above configuration, the voltage for the resonance scan is applied to the electrode of the piezoelectric elements 132 included in the resonance driver part 13, thereby deforming the piezoelectric films in the piezoelectric elements 132 and providing the resonance vibration to the support beams 12. Thus, the mirror 11 swings about the axis of the support beams 12.

Further, the voltage for the compulsive scan is applied to the electrode of the piezoelectric elements 152 included in the compulsive driver part 15, thereby deforming the piezoelectric films in the piezoelectric elements 152 and causing the resonance driver part 13 to swing about the axis parallel with the y direction. In the present embodiment, the same waveform voltage is applied to each of the piezoelectric elements 152a and 152b.

Thereby, the mirror 11 swings about the axis A1 parallel with the x direction, and swings about the axis A2 parallel with the y direction. The light source 2 irradiates the mirror 11 with the light beam of the color according to the signal from the control circuit 3, enabling the two-dimensional scan.

Figure 4:
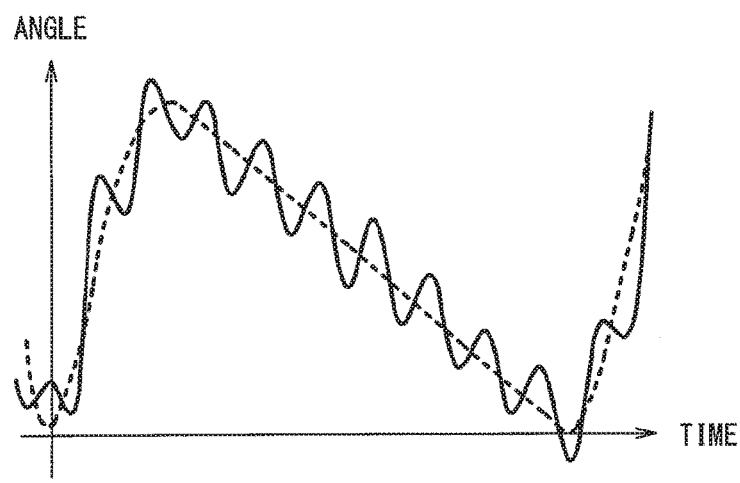
FIG. 4 is a graph illustrating an angle of a mirror.

The voltage for the compulsive scan applied to the compulsive driver part 15 by the control circuit 3 is the voltage according to the drive signal having a sawtooth waveform. It is desirable that the voltage for the compulsive scan allows the mirror 11 to swing as illustrated with the broken line in FIG. 4, i.e., the graph of the angle versus time to become sawtooth waveform. In fact, the ringing may be sometimes contained in the movement of the mirror 11 as illustrated with the solid line in FIG. 4.

The ringing of the mirror 11 is caused by the resonance components contained in the drive signal. The following explains the process removing the resonance components to reduce the ringing of the mirror 11.

It is further noted that a flowchart described includes sections (also referred to as steps), which are represented, for instance, as S101. Further, each section can be divided into several sections while several sections can be combined into a single section. Each section may be referred to as a device or a structure-modified name; for instance, a detection section may be referred to as a detection device or a resonance frequency detector. Further, as explained above, each section can be achieved not only (i) as a software section in combination with a hardware unit (e.g., computer), but also (ii) as a section of a hardware circuit (e.g., integrated circuit, hard-wired logic circuit), including or not including a function of a related apparatus. Further, the section of the hardware circuit may be Inside of a microcomputer.

Figure 5:
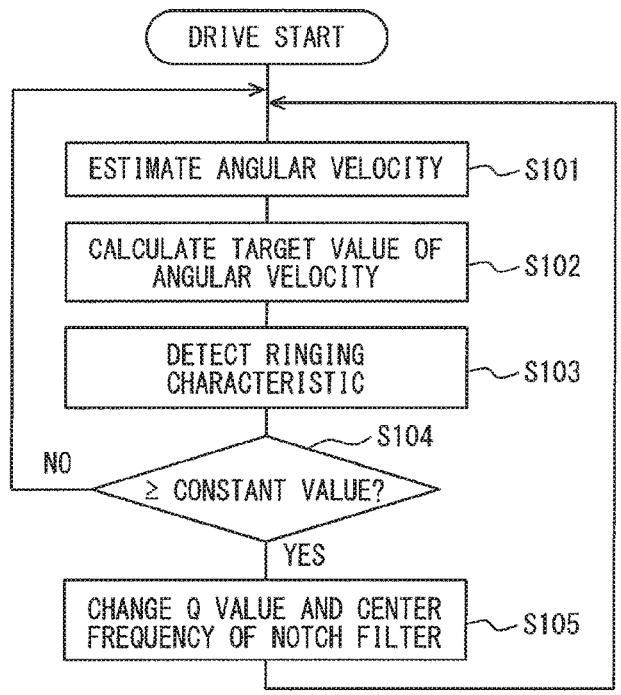
FIG. 5 is a flowchart illustrating an operation executed by a control circuit.

The control circuit 3 performs an operation illustrated in the flowchart in FIG. 5, and suppresses the ringing of the mirror 11. First, at S101, the control circuit 3 estimates an angular velocity of the mirror 11 in response to the start of the drive of the optical scanning apparatus 100.

Figure 6:
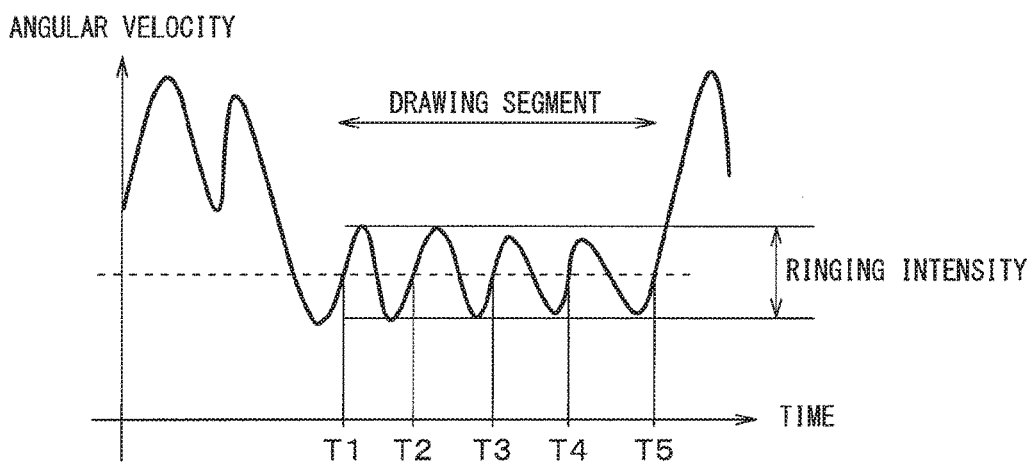
FIG. 6 is a graph illustrating an angular velocity of a mirror.

In detail, the angular velocity calculator 34 acquires the signal from the angle sensors 17b and 17c during a predetermined period of time including the drawing segment and calculates the angle of the mirror 11 using the acquired signal. The angular velocity calculator 34 then differentiates the angle to acquire the angular velocity of the mirror 11. In the present embodiment, the angles are calculated at sampling points of times and a difference per time that is a difference between the calculated angles at the neighboring sampling points of times is regarded as an angular velocity of the mirror 11. The solid line in FIG. 6 illustrates the angular velocity of the mirror 11 estimated by the angular velocity calculator 34. After estimating the angular velocity of the mirror 11, the control circuit 3 advances to S102.

At S102, the control circuit 3 calculates a target value of the angular velocity of the mirror 11 based on the output of the angle sensors 17b and 17c. In detail, the target angular velocity calculator 35 calculates the average value of the portion contained in the drawing segment in the data of the angular velocity of the mirror 11 estimated by the angular velocity calculator 34, as a target value of the angular velocity of the mirror 11. The broken line in FIG. 6 illustrates the target value of the angular velocity calculated by the target angular velocity calculator 35. After calculating the target value of the angular velocity of the mirror 11, the control circuit 3 advances to S103.

At S103, the control circuit 3 detects the characteristic of the ringing. First, the resonance frequency detector 33a of the resonance characteristic detector 33 detects the frequency of the vibration of the mirror 11 based on the time difference between two dock times; at each of two dock times, the angular velocity calculated by the angular velocity calculator 34 accords with the target value calculated by the target angular velocity calculator 35. In detail, the Intersecting points between the graph of the angular velocity of the mirror 11 estimated by the angular velocity calculator 34 and the target value of the angular velocity calculated by the target angular velocity calculator 35 are acquired in the drawing segment. The time differences between any two intersecting points between which another one intersection point is sandwiched are acquired in the drawing segment; the Inverse numbers of the acquired time differences are averaged to find the frequency of the ringing. The time differences between any two intersecting points between which another one intersecting point is sandwiched correspond to the time difference between T1 and T2, the time difference between T2 and T3, the time difference between T3 and T4, and the time difference between T4 and T5 in FIG. 6, for instance.

Next, the resonance intensity detector 33b of the resonance characteristic detector 33 detects the intensity of the ringing. In detail, the maximum and the minimum of the angular velocity in the drawing segment are acquired in the graph of the angular velocity of the mirror 11 estimated by the angular velocity calculator 34 and the difference between the maximum and the minimum is regarded as the intensity of the ringing.

After detecting the characteristic of the ringing, the control circuit 3 advances to S104, where it is determined whether the optimization of the drive signal is needed based on the characteristic of the ringing. In detail, the control circuit 3 determines whether the intensity of the ringing acquired at S103 is equal to or greater than a predetermined value. When the intensity of the ringing is not equal to or greater than the predetermined value, the control circuit 3 advances to S101. When the intensity of the ringing is equal to or greater than the predetermined value, the control circuit 3 advances to S105.

At S105, the control circuit 3 optimizes the drive signal based on the characteristic of the ringing. In detail, the unnecessary vibration controller 32 changes Q value and the center frequency of the notch filter, and processes the drive signal with the notch filter. The center frequency of the notch filter is the frequency acquired by the resonance frequency detector 33a at S103. In addition, as the intensity of the ringing acquired by the resonance intensity detector 33b at S103 is greater, the frequency component leading to the ringing is removed more greatly. This increases the Q value of the notch filter.

The control circuit 3 changes the Q value and the center frequency of the notch filter, and processes the drive signal with the notch filter to optimize, then advancing to S101. The above operation of the control circuit 3 removes the frequency component causing the ringing from the drive signal of the compulsive driver part 15 to thereby suppress the ringing.

The conventional optical scanning apparatus such as an optical deflector described in Patent literature 1 detects the frequency components causing the ringing by analyzing frequency components of the data acquired by the frequency sweep of the drive signal, and eliminates the detected frequency components from the drive signal with a filter. In this case, during the detection, the drive signal is not a sawtooth wave but a sine wave. This prevents normal drawing of the image. The drawing of the image needs to be stopped during detection of the frequency of the ringing.

By contrast, in the optical scanning apparatus 100 of the present embodiment, during the drawing being operated, the angular velocity calculator 34 acquires the angular velocity based on the difference per time of the angle of the mirror 11 acquired from the output of the angle sensors 17b and 17c, and the resonance characteristic detector 33 detects the characteristic of the ringing using the waveform of the angular velocity and the target value of the angular velocity. Thus, the normal operation of the drawing is enabled while detecting the characteristic of the ringing. This allows the detection of the frequency of the ringing during the scanning.

In addition, when FFT is used like in the optical deflector described in Patent literature 1, the complicated calculation is needed, increasing the costs in processing. In addition, when the frequency is detected with BPF like in a driver described in JP 2010-092018 A, using a single BPF needs to increase processing time while using a plurality of BPFs needs to increase costs for circuits.

By contrast, in the present embodiment, the angular velocity is acquired based on the difference per time of the angle of the mirror 11 acquired by the angle sensors 17b and 17c, the target value of the angular velocity is acquired using the angular velocity, and the frequency of the ringing is detected using the angular velocity and the target value of the angular velocity. Therefore, complicated calculation is unnecessary, and the frequency of the ringing is detectable by the method easier than the case using the FFT. This can reduce the processing costs, the processing time, and the costs for circuits.

Second Embodiment

The following will describe a second embodiment of the present disclosure. The present embodiment changes the configuration of the control circuit 3 according to the first embodiment, but does not change the other; thus, different portions from the first embodiment will be only explained.

Figure 7:
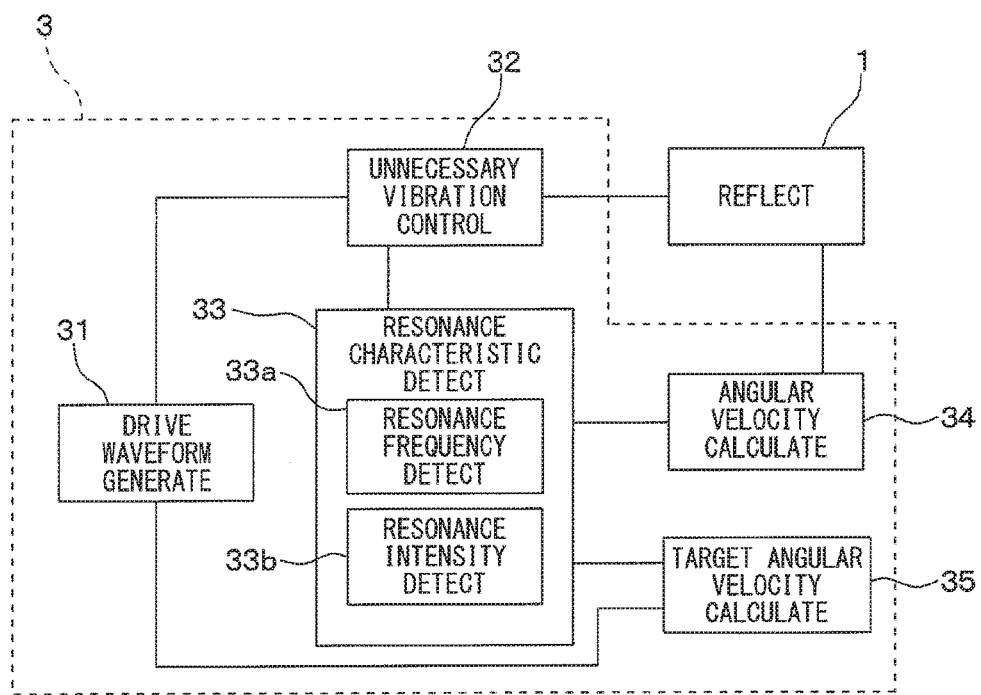
FIG. 7 is a diagram illustrating a configuration of a control circuit according to a second embodiment.

As illustrated in FIG. 7, in the present embodiment, the angular velocity calculator 34 is not connected with the target angular velocity calculator 35; the angular velocity calculator 34 does not transmit any signal to the target angular velocity calculator 35. In addition, the drive waveform generator 31 is connected with the target angular velocity calculator 35; the drive waveform generator 31 transmits a drive signal to the target angular velocity calculator 35.

A storage area of the control circuit 3 stores the relation between the drive signal and the output voltage to the piezoelectric elements 152 included in the compulsive driver part 15, and the relation between the output voltage and the angle of the mirror 11. At S102, the target angular velocity calculator 35 calculates the angle and the angular velocity of the mirror 11 in the drawing segment based on the above stored relations and the drive signal transmitted from the drive waveform generator 31, and defines the calculated angular velocity as a target value of the angular velocity of the mirror 11.

The present embodiment which calculates the target value of the angular velocity from the drive signal can provide the same effect as the first embodiment. In addition, the present embodiment, which calculates the target value of the angular velocity from the drive signal, can acquire the target value of the angular velocity with a sufficient accuracy. This allows the frequency and intensity of the ringing to be acquired with sufficient accuracy.

Other Embodiments

For instance, the above first embodiment uses the average value of the angular velocity as the target value of the angular velocity as an example of the target value calculated based on the angular velocity of the mirror 11 contained in the drawing segment. This is only one example. The average value of the maximum and the minimum of the angular velocity of the mirror 11 contained in the drawing segment may be used as a target value of the angular velocity of the mirror 11.

In addition, in the above first embodiment, the optimization is made by processing the drive signal using the notch filter. In contrast, the optimization may be made by processing the drive signal by processing the drive signal using a band stop filter which decreases the signal of the predetermined frequency band. In addition, optimization may be made by changing the ratio of components of the sine waves, which constitute the drive signal, based on the frequency of the ringing.

In addition, the waveforms of the voltage applied to the piezoelectric elements 152a and 152b may be different from each other. In addition, the detection of the characteristic of the ringing and the optimization of the drive signal may be made with respect to each of the piezoelectric elements 152a and 152b. That is, with respect to each of the piezoelectric elements 152a and 152b, the drive signal is generated; then, the drive signal for the piezoelectric element 152a may be optimized using the output from the angle sensor 17b, while the drive signal on the piezoelectric element 152b may be optimized using the output from the angle sensor 17c. Suppose a method in which the compulsive driver part 15 is provided with a plurality of piezoelectric elements 152 and the unnecessary vibration controller 32 optimizes the drive signals for the respective piezoelectric elements 152. Such a method is effective in the case that the movement of the mirror 11 contains the vibration due to the torsion.

In addition, the center frequency of the notch filter or the band stop filter used to process the drive signal may be different from the frequency of the ringing detected by the resonance frequency detector 33a. For instance, the center frequency of the notch filter or the band stop filter may be integral number multiple or integral number-th part of the frequency of the ringing detected by the resonance frequency detector 33a.

In addition, at S105, the Q value of the notch filter may not be changed, but only the center frequency may be changed.

In addition, a differentiation circuit may be installed in between the control circuit 3 and the angle sensors 17b and 17c. Such a differentiation circuit may be used to acquire the angular velocity about the axis A2 of the mirror 11. In addition, the angle sensors 17b and 17c may be arranged in between the base parts 151 and the piezoelectric elements 152. In addition, the angle sensors 17 may be configured to be other than the strain gauge.

In addition, a drawing segment may be defined to be a linear segment where the magnitude in change per time is constant among the waveform acquired by the unnecessary vibration controller 32 optimizing the drive signal having a sawtooth waveform generated by the drive waveform generator 31.

In addition, the data used in order that the target angular velocity calculator 35 calculates the target value of the angular velocity of the mirror 11 may be contained in an entirety of the drawing segment, or in a part of the drawing segment in the data of the angular velocity of the mirror 11 calculated by the angular velocity calculator 34. However, in order to obtain the frequency and intensity of the ringing with sufficient accuracy, more data of the angular velocity used by the target angular velocity calculator 35 are more desirable. Therefore, it is desirable that the target angular velocity calculator 35 calculates the target value using the angular velocity calculated by the angular velocity calculator 34 in an entirety of the drawing segment.

In addition, the drive waveform generator 31 may generate a drive signal including an increasing portion and a decreasing portion; the increasing portion and the decreasing portion may be alternated repeatedly. In the increasing portion, the magnitude of the signal increases by an increasing amount for an increasing period of time; in the decreasing portion, the magnitude of the signal decreases by a decreasing amount equal to the increasing amount for a decreasing period of time shorter than the increasing period of time.

In addition, the axis A2 just needs to be a direction different from the x direction, and may not be parallel with the y direction.

While the present disclosure has been described with reference to embodiments thereof, it is to be understood that the disclosure is not limited to the embodiments and constructions. The present disclosure is intended to cover various modification examples and equivalent arrangements. In addition, the various combinations and configurations, and other combinations and configurations, including more, less or only a single element, are also within the spirit and scope of the present disclosure.

The invention claimed is:
1. An optical scanning apparatus comprising:
   a mirror having a reflective face to reflect a light beam;
   support beams configured to support the mirror respectively at opposite sides in a one direction on the reflective face of the mirror, the support beams being extended respectively in opposite directions in the one direction;

a resonance driver part configured to swing the mirror about a first axis parallel with the one direction by applying resonance vibration to the support beams;

a compulsive driver part configured to swing the mirror about a second axis parallel with a different direction different from the one direction by providing piezoelectric elements with a voltage;

an angle measurer part configured to measure an angle about the second axis of the mirror; and a control circuit configured to provide the piezoelectric elements with a voltage according to an output of the angle measurer part, the control circuit including:

an angular velocity calculator configured to calculate an angular velocity about the second axis of the mirror based on the angle of the mirror measured by the angle measurer part;

a target angular velocity calculator configure to calculate a target value of the angular velocity;

a resonance frequency detector configured to detect a frequency of vibration about the second axis of the mirror using the angular velocity and the target value;

a drive waveform generator configured to generate a drive signal having a sawtooth waveform; and an unnecessary vibration controller configured to optimize the drive signal to reduce an unnecessary vibration about the second axis of the mirror based on the frequency of vibration of the mirror detected by the resonance frequency detector and provide the piezoelectric elements with a voltage according to the optimized drive signal, wherein the resonance frequency detector detects the frequency of vibration of the mirror using a waveform and the target value of the angular velocity of the mirror during a duration in which the drive signal having the sawtooth waveform is transmitted to the unnecessary vibration controller from the drive waveform generator.

2. The optical scanning apparatus according to claim 1, wherein the voltage with which the unnecessary vibration controller provides the piezoelectric elements has a waveform including a linear segment where a magnitude in change per time is within a predetermined range centered on a constant value.

3. The optical scanning apparatus according to claim 2, wherein the voltage with which the unnecessary vibration controller provides the piezoelectric elements is constant in the magnitude in change per time in the linear segment.

4. The optical scanning apparatus according to claim 2, wherein the unnecessary vibration controller optimizes the drive signal with a filter that decreases a signal of a predetermined frequency band, and changes a center frequency of the frequency band based on the frequency of vibration of the mirror detected by the resonance frequency detector.

5. The optical scanning apparatus according to claim 4, wherein the unnecessary vibration controller changes a magnitude in signal decrease based on a difference between a maximum and a minimum in the linear segment of the angular velocity calculated by the angular velocity calculator.

6. The optical scanning apparatus according to claim 5, wherein the unnecessary vibration controller changes the magnitude in signal decrease based on a difference between a maximum and a minimum in an entirety of the linear segment of the angular velocity calculated by the angular velocity calculator.

7. The optical scanning apparatus according to claim 2, wherein the unnecessary vibration controller optimizes the drive signal when a difference between a maximum and a minimum in the linear segment of the angular velocity calculated by the angular velocity calculator is equal to or greater than a constant value.

8. The optical scanning apparatus according to claim 7, wherein the unnecessary vibration controller optimizes the drive signal when a difference between a maximum and a minimum in an entirety of the linear segment of the angular velocity calculated by the angular velocity calculator is equal to or greater than a constant value.

9. The optical scanning apparatus according to claim 2, wherein the target angular velocity calculator calculates the target value based on the angular velocity calculated by the angular velocity calculator.

10. The optical scanning apparatus according to claim 9, wherein the target angular velocity calculator calculates, as the target value, an average value of the angular velocity calculated by the angular velocity calculator in the linear segment.

11. The optical scanning apparatus according to claim 10, wherein the target angular velocity calculator calculates, as the target value, an average value of the angular velocity calculated by the angular velocity calculator in an entirety of the linear segment.

12. The optical scanning apparatus according to claim 9, wherein the target angular velocity calculator calculates, as the target value, an average value between a maximum and a minimum of the angular velocity calculated by the angular velocity calculator in the linear segment.

13. The optical scanning apparatus according to claim 12, wherein the target angular velocity calculator calculates, as the target value, an average value between a maximum and a minimum of the angular velocity calculated by the angular velocity calculator in an entirety of the linear segment.

14. The optical scanning apparatus according to claim 1, wherein:

the waveform of the drive signal is a combined wave formed by combining different sine waves having mutually different frequencies; and the unnecessary vibration controller changes a ratio of each of the different sine waves in the combined wave based on the frequency of vibration of the mirror detected by the resonance frequency detector.

15. The optical scanning apparatus according to claim 1, wherein the resonance frequency detector detects the frequency of vibration of the mirror based on a time difference between two clock times, wherein at each of the two clock times the angular velocity calculated by the angular velocity calculator accords with the target value calculated by the target angular velocity calculator.

16. The optical scanning apparatus according to claim 1, wherein
the angular velocity calculator calculates, as the angular velocity, a difference per time of the angle of the mirror measured by the angle measurer part.

17. The optical scanning apparatus according to claim 1, wherein
the target angular velocity calculator calculates the target value based on the drive signal.

18. The optical scanning apparatus according to claim 1, wherein
the compulsive driver part includes a plurality of piezoelectric elements; and
the unnecessary vibration controller optimizes the drive signal to each of the plurality of piezoelectric elements.

* * * * *